(12) United States Patent
Chen et al.

(10) Patent No.: US 7,041,567 B2
(45) Date of Patent: May 9, 2006

(54) ISOLATION STRUCTURE FOR TRENCH CAPACITORS AND FABRICATION METHOD THEREOF

(75) Inventors: Yinan Chen, Taipei (TW); Ping Hsu, Taipei Hsien (TW); Li-Han Lu, Taipei Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/904,593

(22) Filed: Nov. 18, 2004

(65) Prior Publication Data

US 2005/0153506 A1    Jul. 14, 2005

Related U.S. Application Data

(62) Division of application No. 10/707,805, filed on Jan. 13, 2004.

(51) Int. Cl.
*H01L 21/461*   (2006.01)
*H01L 27/108*   (2006.01)
*H01L 29/76*    (2006.01)
*H01L 29/94*    (2006.01)
*H01L 31/119*   (2006.01)

(52) U.S. Cl. .............. 438/386; 438/736; 438/734; 438/700; 438/702; 438/737; 438/738; 438/743; 438/744; 257/301; 257/304; 257/306

(58) Field of Classification Search ............. 438/736, 438/734, 700, 702, 737, 738, 743, 744, 386; 257/301, 302, 304, 306
See application file for complete search history.

(56) References Cited

U.S. PATENT DOCUMENTS

| | | | |
|---|---|---|---|
| 5,770,465 A | * | 6/1998 | MacDonald et al. ............ 216/2 |
| 5,989,978 A | * | 11/1999 | Peidous ....................... 438/436 |
| 6,046,487 A | * | 4/2000 | Benedict et al. ............. 257/510 |
| 6,146,974 A | * | 11/2000 | Liu et al. ..................... 438/435 |
| 6,514,816 B1 | | 2/2003 | Lee |

* cited by examiner

*Primary Examiner*—Steven Leko
*Assistant Examiner*—Samuel A. Gebremariam
(74) *Attorney, Agent, or Firm*—Winston Hsu

(57) ABSTRACT

This invention relates to a method for self-aligned fabricating an isolation structure of a trench capacitor. The method takes two steps to etch the substrate for forming the shallow trench of the isolation structure, wherein the conductive layer and the collar oxide layer of the trench capacitor remain intact during the etching processes.

12 Claims, 11 Drawing Sheets

US 7,041,567 B2

ISOLATION STRUCTURE FOR TRENCH CAPACITORS AND FABRICATION METHOD THEREOF

CROSS REFERENCE

This application is a division of application Ser. No. 10/707,805 filed on Jan. 13, 2004.

BACKGROUND OF INVENTION

1. Field of the Invention

The invention relates to an isolation structure of a trench capacitor and a fabricating method thereof, and more particularly, to an isolation structure of a trench capacitor and a fabricating method thereof applying to dynamic random access memories (DRAMs).

2. Description of the Prior Art

With the development of electrical products, integrated circuits and electrical products have been pushed for size reductions to match the trend of high integration and high density. As a result, trench capacitors have become main structures of DRAM products. The fabrication of trench capacitors comprises forming a plurality of deep trenches in a substrate, forming capacitors in the deep trenches, and electrically connecting the trench capacitors with transistors so as to reduce the area of each memory cell.

Please refer to FIG. 1. FIG. 1 is a section view of two adjacent trench capacitors according to the prior art. The substrate 10 comprises two adjacent trench capacitors 12, 14 disposed in the deep trenches 16, 18 respectively. The trench capacitor 12 comprises a storage node 24, capacitor dielectric layer 26, and a $N^+$ buried plate 28. The trench capacitor 12 usually further comprises a buried strap 20 disposed on the storage node 24 and contacting the storage node 24. The buried strap 20 is used for electrically connecting the trench capacitor 12 and an adjacent active area (AA). A collar oxide layer 22 is disposed on the surface of the deep trench 16 for isolating the storage node 24 and the substrate 10. Furthermore, a shallow trench isolation (STI) 30 is disposed between the trench capacitors 12, 14 for isolating the trench capacitors 12, 14. As shown in FIG. 1, the STI 30 straddles on the two deep trenches 16, 18 and overlaps a portion of the collar oxide layer 22 and the storage node 24 of the deep trenches 16, 18.

Please refer to FIG. 2 to FIG. 3. FIG. 2 to FIG. 3 are schematic diagrams of the fabrication of the STI 30 of the trench capacitors 12, 14 shown in FIG. 1. First, a doped silicate glass layer 34 is deposited on the substrate 10 comprising the trench capacitors 12, 14, wherein the substrate 10 already has a pad layer 32 thereon. The doped silicate glass layer 34 covers the pad layer 32 and fills the recesses 16a, 18a of the deep trenches 16, 18. Then, an anti-reflection coating (ARC) layer 36 is deposited on the doped silicate glass layer 34, and a photoresist layer 38 is coated on the ARC layer 36. After that, a lithography process is performed to pattern the photoresist layer 38 so as to form an opening 40 defining a shallow trench.

As shown in FIG. 3, a plasma-dry-etching process is performed by taking the photoresist layer 38 as a hard mask. Therefore the ARC layer 36, the doped silicate glass layer 34, the pad layer 32, the substrate 10, and a portion of the buried strap 20, the storage node 24, and the collar oxide layer 22 are removed through the opening 40, so that a shallow french 42 is formed. Then, the photoresist layer 38, the residual ARC layer 36, and the residual doped silicate glass layer 34 are removed. Finally, the shallow trench 42 and the top recesses of the deep trench 16, 18 are filled with isolation materials, and the isolation materials are planerized to complete the fabrication of the STI 30 of the trench capacitors according to the prior art.

However, for this prior-art method, when the photoresist layer 38 is used to define the shallow trench 42 for directly fabricating the STI 30, the photomask for defining the active area is susceptible to misalignment so that the STI 30 shifts to one of the deep trenches 16, 18. As shown in FIG.4, the STI 30 leans toward the deep trench 16. In this situation, a serious defect may occur for the left trench capacitor 12. This is because the contact area of the storage node 24 and the buried strap 20 is reduced resulting in the resistance of the trench capacitor 12 being raised. Even more, the buried strap 20 may fail to contact the storage node 24 so as to cause a broken circuit. Consequently, the french capacitor 12 cannot work.

Since the resistances of the trench capacitors 12 and 14, influenced by the overlapping region of the active area and the trench capacitor 12 and the contact area of the buried strap 20 and storage node 24, are one of the key factors affecting the DRAM performance, the area of the storage node 24 surrounded by the collar oxide layer 22 should be larger when fabricating the trench capacitor 12. Referring to FIG. 1, a parameter "X" is defined, wherein the parameter "X" stands for the maximum distance in the overlapping region between the active area and the trench capacitor 12 in the x-direction. For reducing the resistance, the maximum "X" has to be as large as possible. Therefore the area of the deep trench 16 that the shallow trench 42 occupies should be as small as possible. However, according to the fabrication process of the STI 30 in the prior art, this may cause misalignment resulting in electrical leakage. As a result, the prior-art STI and fabrication method thereof needs to be improved for raising the process yield.

SUMMARY OF INVENTION

It is therefore a primary objective of the claimed invention to provide a self-aligned fabricating isolation structure of the trench capacitors to solve the above-mentioned problem.

According to the claimed invention, an isolation structure of a trench capacitor is disclosed. The trench capacitor is disposed in a deep trench of a substrate and comprises a conductive layer in the deep trench and a collar oxide layer disposed on a surface of a sidewall of the deep trench for isolating the conductive layer and the substrate. The isolation structure comprises a first isolation portion and a second isolation portion. The first isolation portion covers the conductive layer and fills a top opening of the deep trench. The second isolation portion directly contacts the first isolation potion and surrounds the deep trench without overlapping the deep trench. The first and the second isolation portions have a first thickness and a second thickness respectively, wherein the second thickness is more than the first thickness.

According to the claimed invention, a method of self-aligned fabricating an isolation structure of a trench capacitor is further disclosed, wherein the trench capacitor is disposed in a deep trench of a substrate, and the substrate comprises a pad layer thereon. A storage node of the trench capacitor and a sidewall of the pad layer together define a recess. The method comprises forming a mask layer and a dielectric layer in sequence on the substrate and a surface of the recess; forming a photoresist layer having an opening that defines a shallow trench on the dielectric layer; etching the dielectric layer, the mask layer, and the pad layer through the opening until the substrate is exposed; and etching the substrate by taking the residual mask layer as an hard mask until a surface of the exposed substrate is lower than a top of the collar oxide layer in the deep trench; wherein the conductive layer and the collar oxide layer remain intact.

It is an advantage of the claimed invention that the present invention method comprises first depositing a mask layer and then performing two steps of etching processes by adjusting the etching selectivity and the etching agent so that the performance of the first step of etching process can be easily controlled when transferring the pattern of the active area. In addition, the claimed invention method has a self-aligning functionality so as to raise the process window to solve the problem of deviation and shift of the isolation structure resulting in low trench capacitor performance. Furthermore, the isolation structure of the claimed invention does not overlap the buried strap and the storage node in the deep trench, so that the whole area of the deep trench can be utilized to contain the storage node and therefore the capacitor resistance is reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
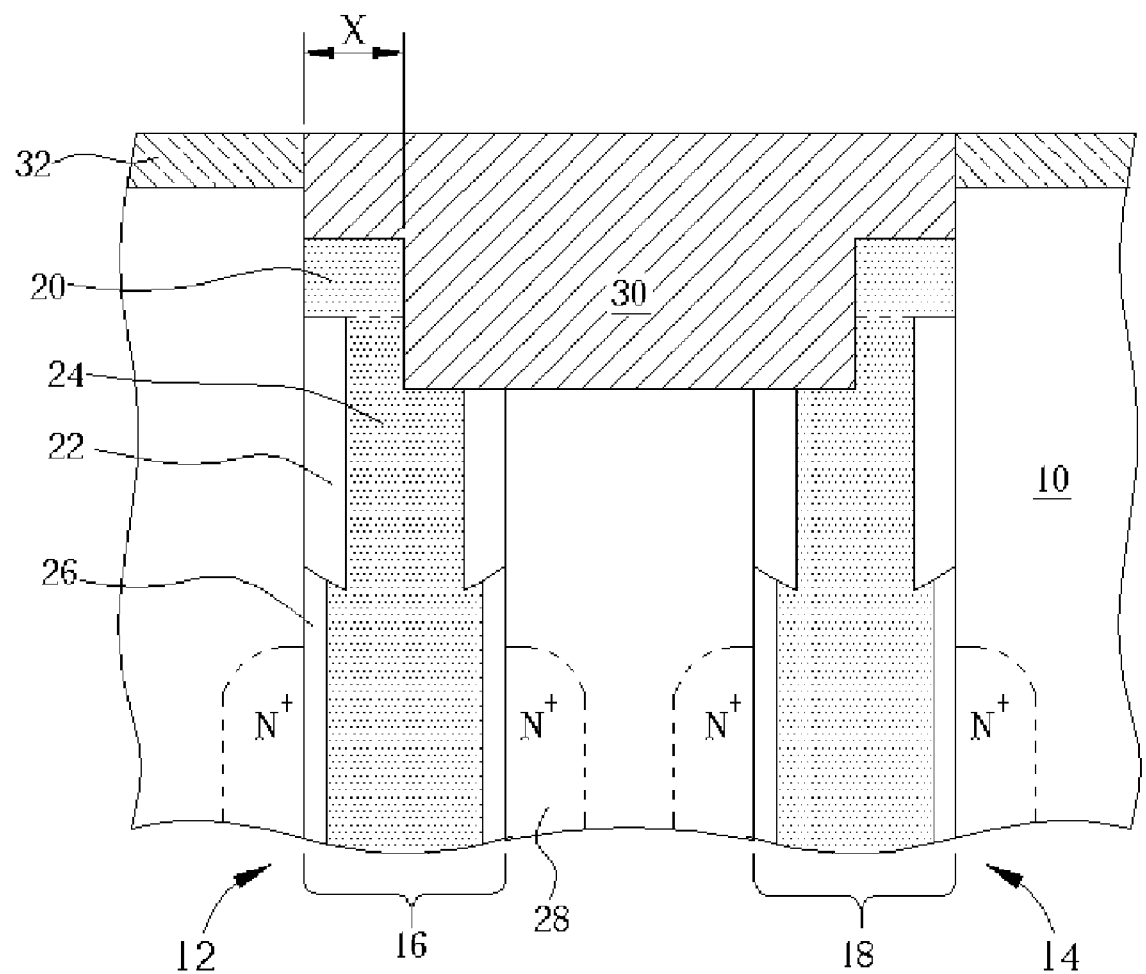
FIG. 1 is a section view of two adjacent trench capacitors according to the prior art.
Figure 2:
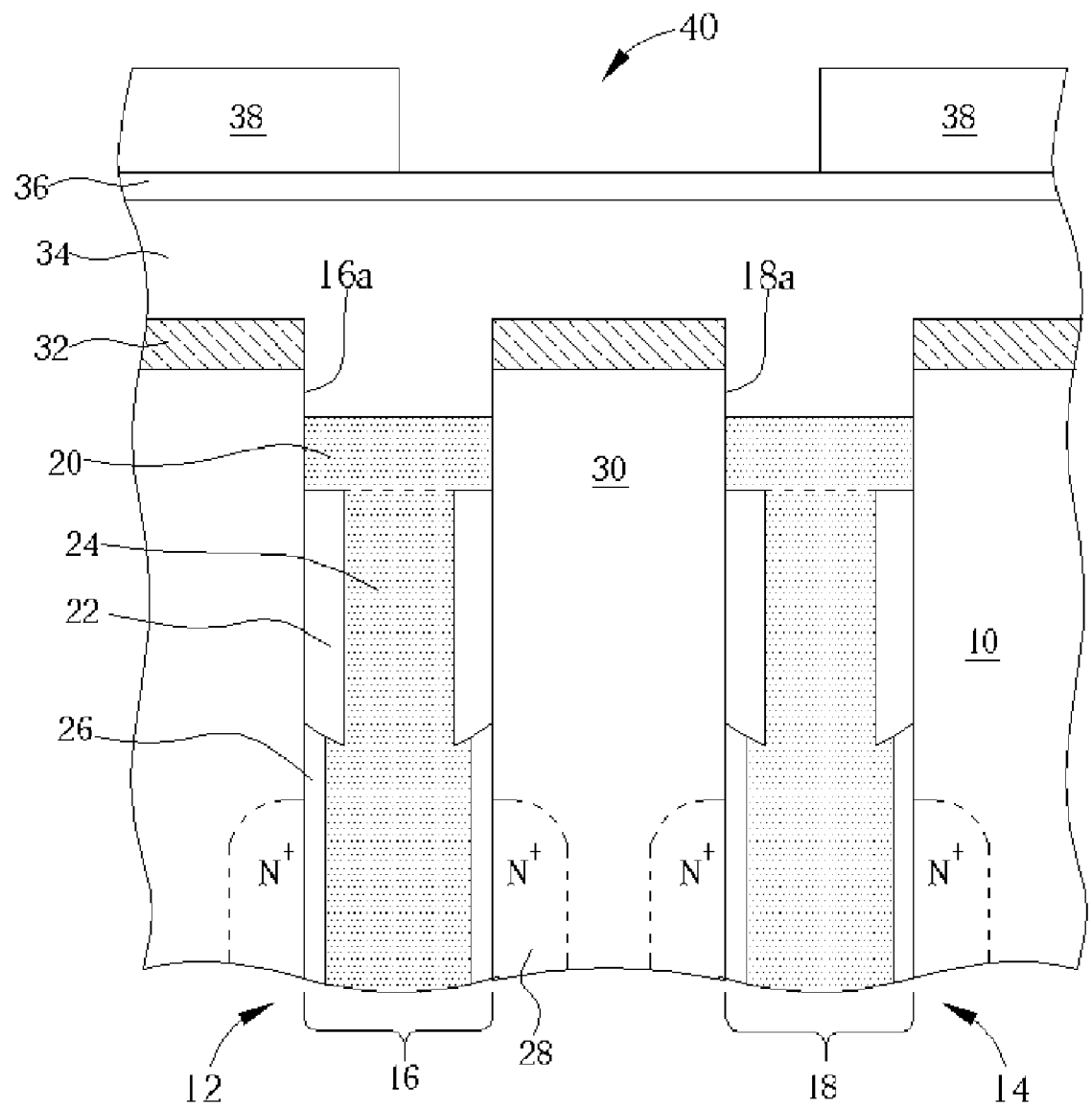
FIGS. 2–3 are schematic diagrams of the fabrication method of the STI of the trench capacitors shown in FIG. 1.
Figure 3:
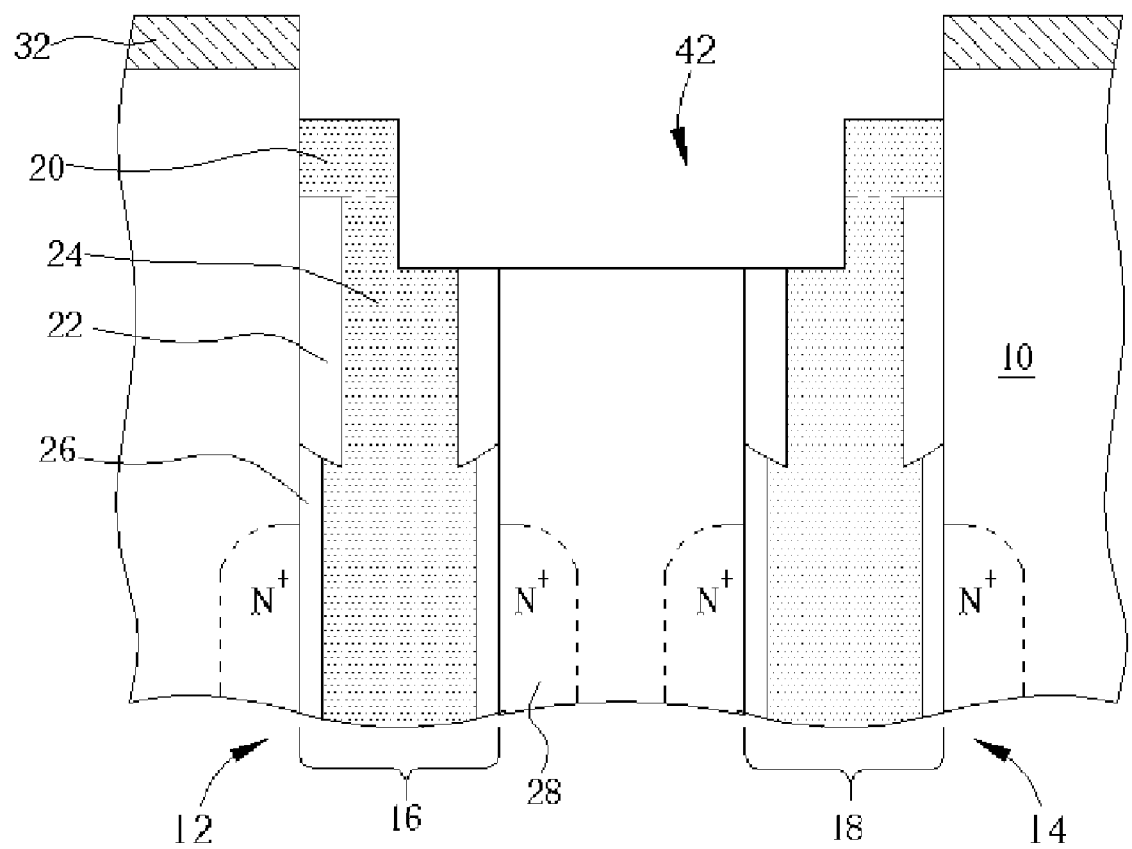
Figure 4:
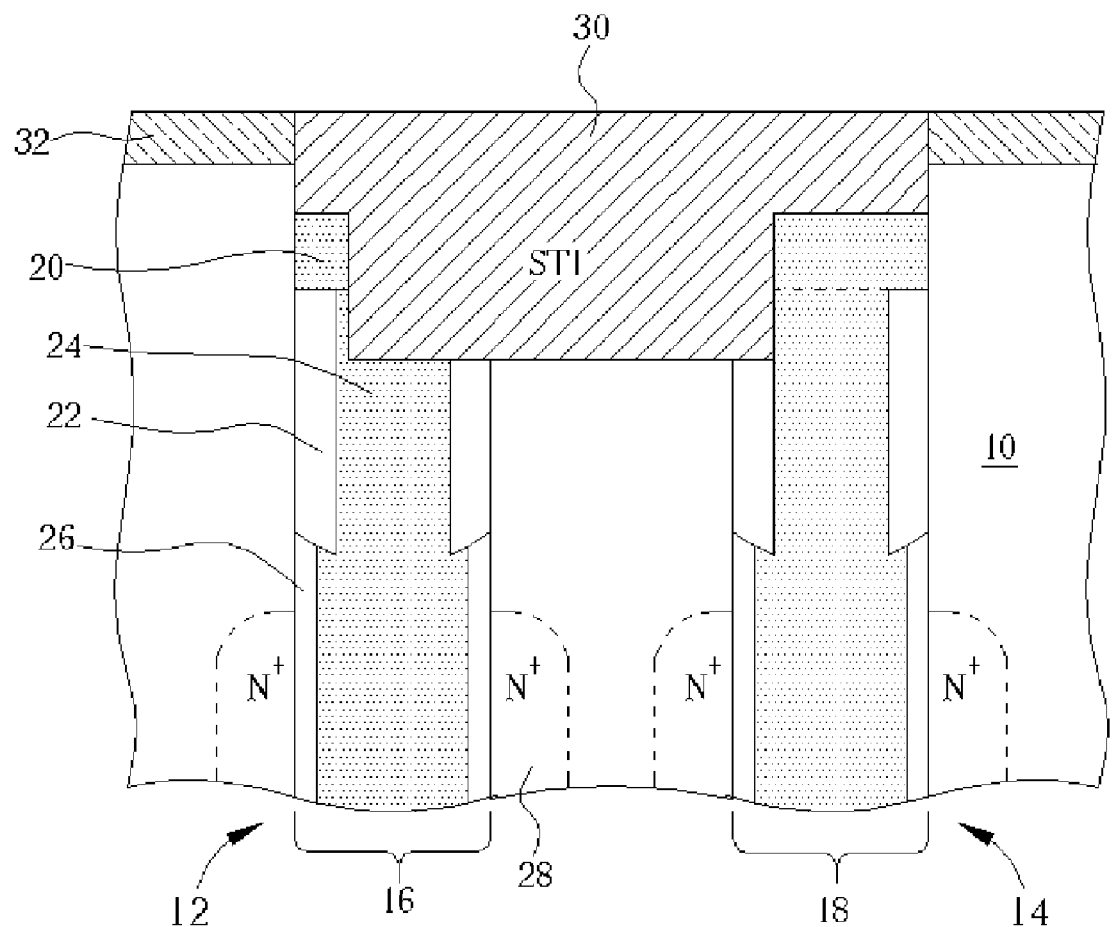
FIG. 4 is a section view of two adjacent trench capacitors with a defect according the prior art.
Figure 5:
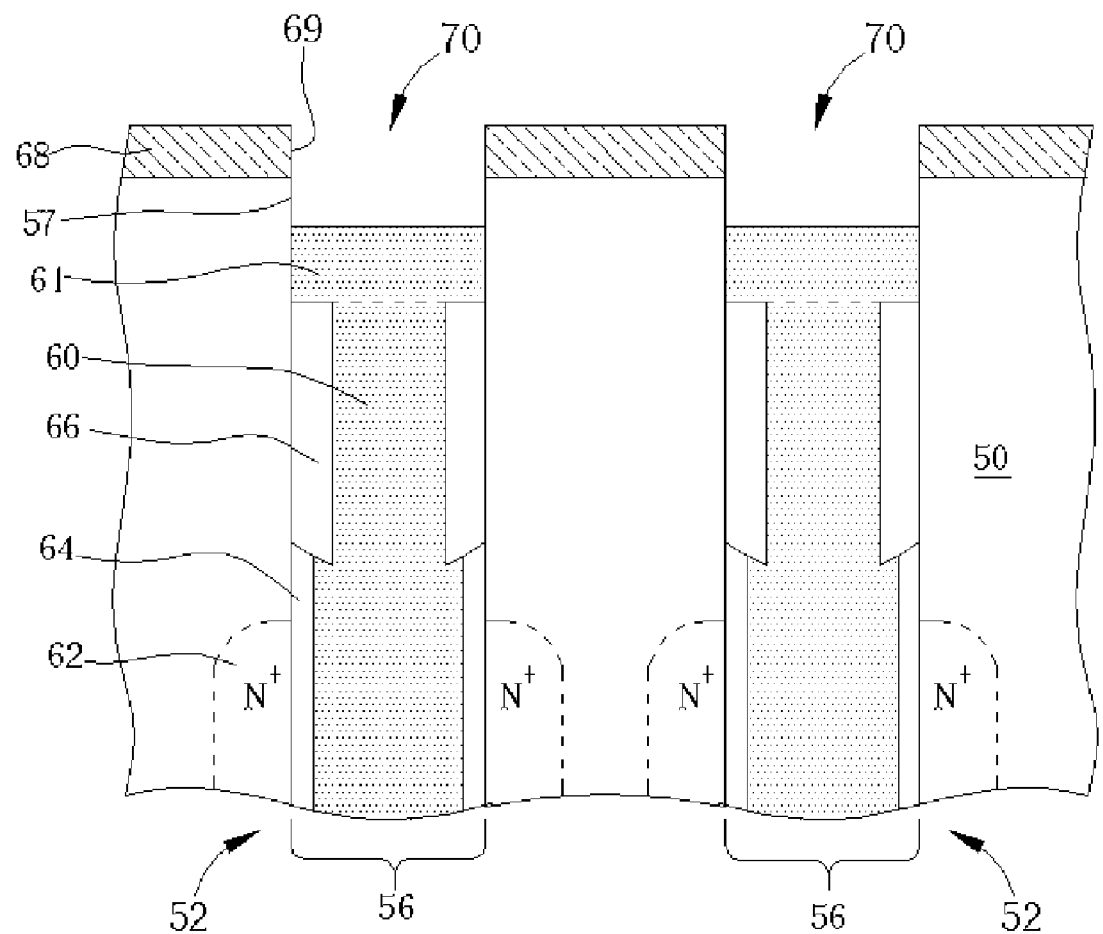
FIGS. 5–11 are schematic diagrams of an isolation structure of two adjacent trench capacitors according to the present invention.
Figure 9:
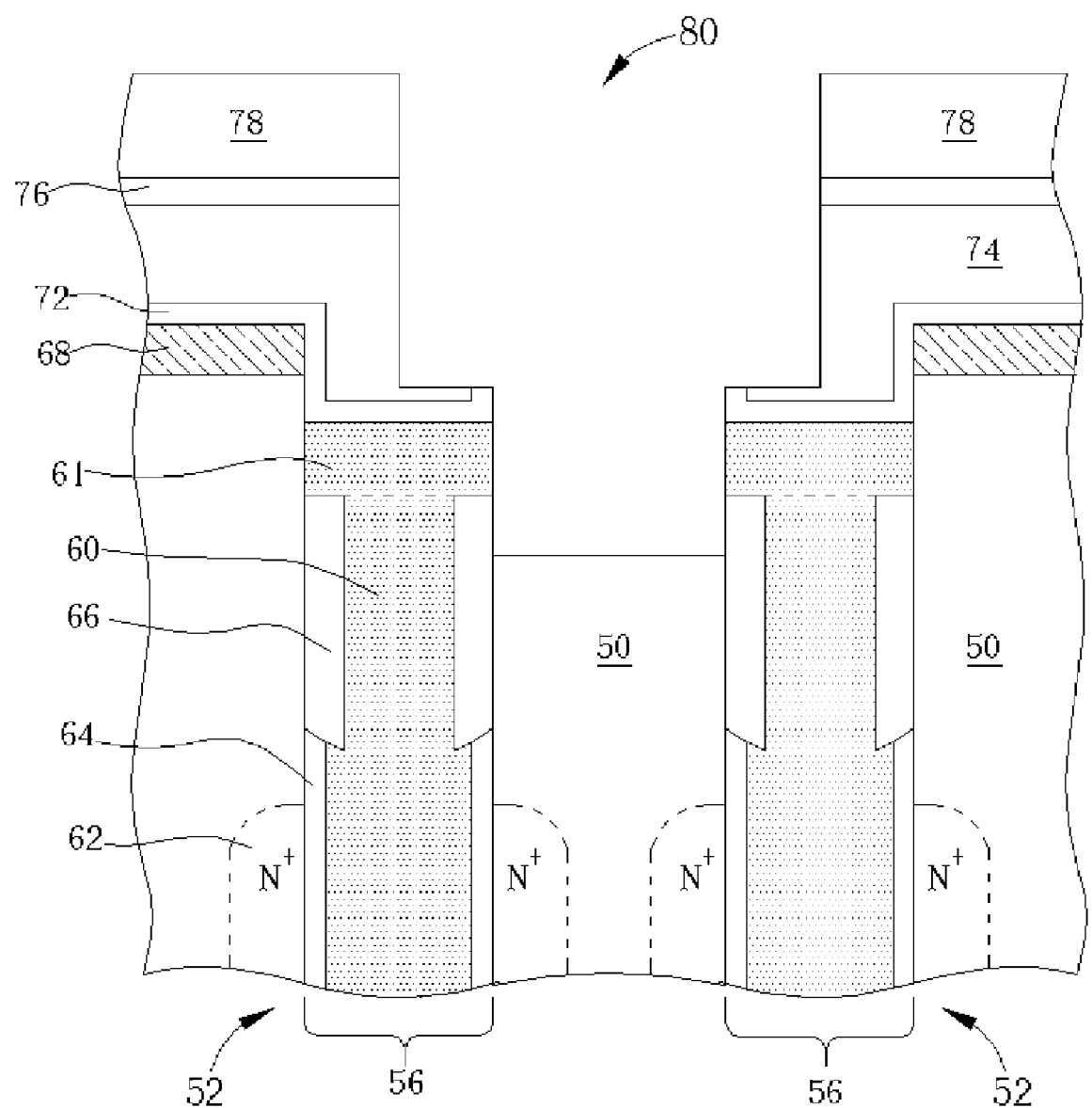
Figure 10:
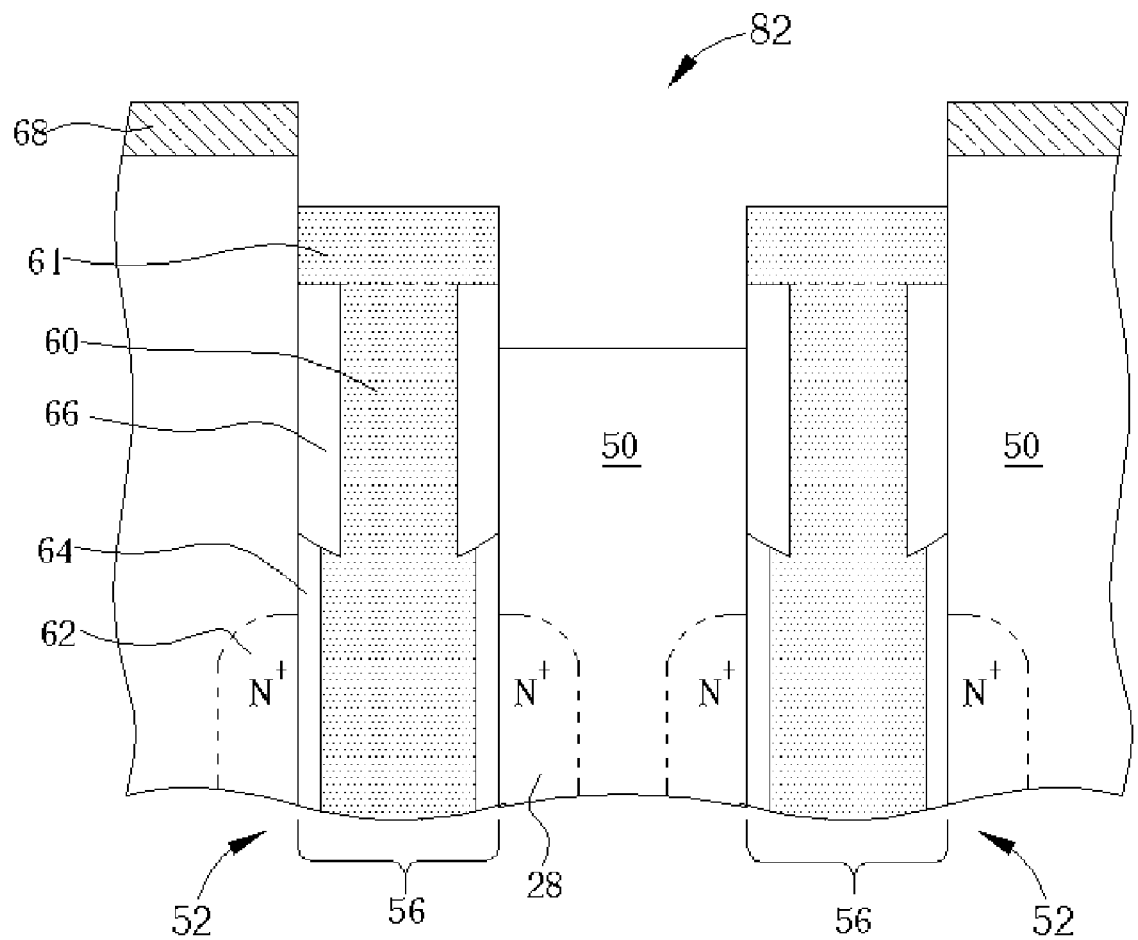
Figure 11:
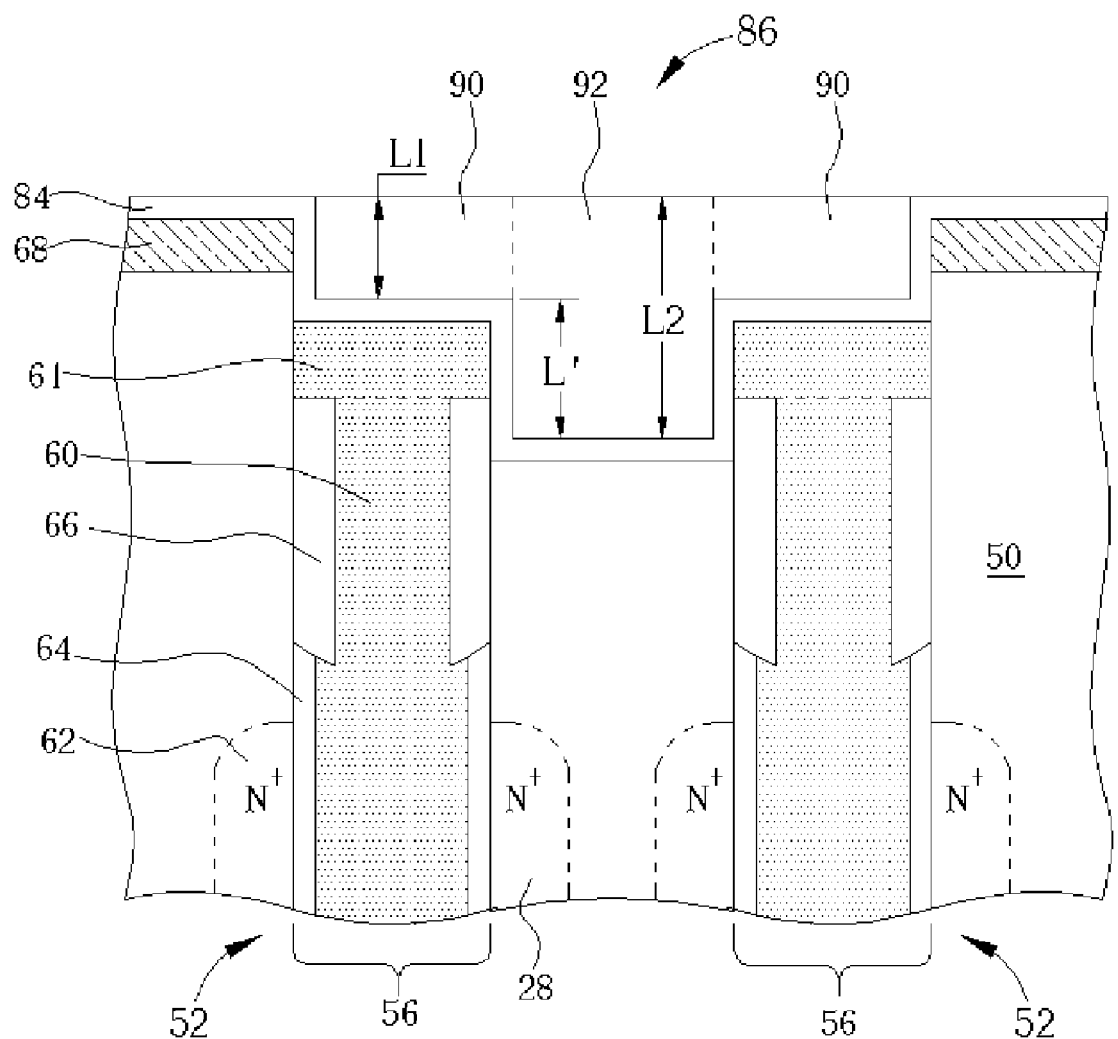

Please refer to FIGS. 5 to 11, which are schematic diagrams of an isolation structure of two adjacent trench capacitors according to the present invention. FIG. 11 is also a section view of the isolation structure of the present invention. As shown in FIG. 5, two trench capacitors 52 are disposed in the deep trenches 56 of the substrate 50. The left trench capacitor 52 comprises a storage node 60 in the deep trench 56, a buried N+ plate 62 surrounding the bottom portion of the deep trench 56, and a capacitor dielectric layer 64 disposed on the surface of the deep trench 56. The trench capacitor 52 further comprises a buried strap 61 on the storage node 60 electrically connected to the storage node 60. The storage node 60 and the buried strap 61 are formed by conductive materials, such as doped poly silicon, metal, or other materials. Mostly, the storage node 60 and the buried strap 61 are formed by three stacked doped poly silicon layers. A collar oxide layer 66 is further disposed on the sidewall of the deep trench 56, which isolates the storage node 60, at the collar of the deep trench 56, and the substrate 50. The substrate 50 comprises a pad layer 68 thereon. The pad layer 68 may selectively comprise a pad nitride layer and a pad oxide layer. However, the material of the pad layer 68 is not limited. As shown in FIG. 5, the top surface of the buried strap 61, the top sidewall 57 of the deep trench 56, and the sidewall 69 of the pad layer 68 together form a recess 70.

Figure 6:
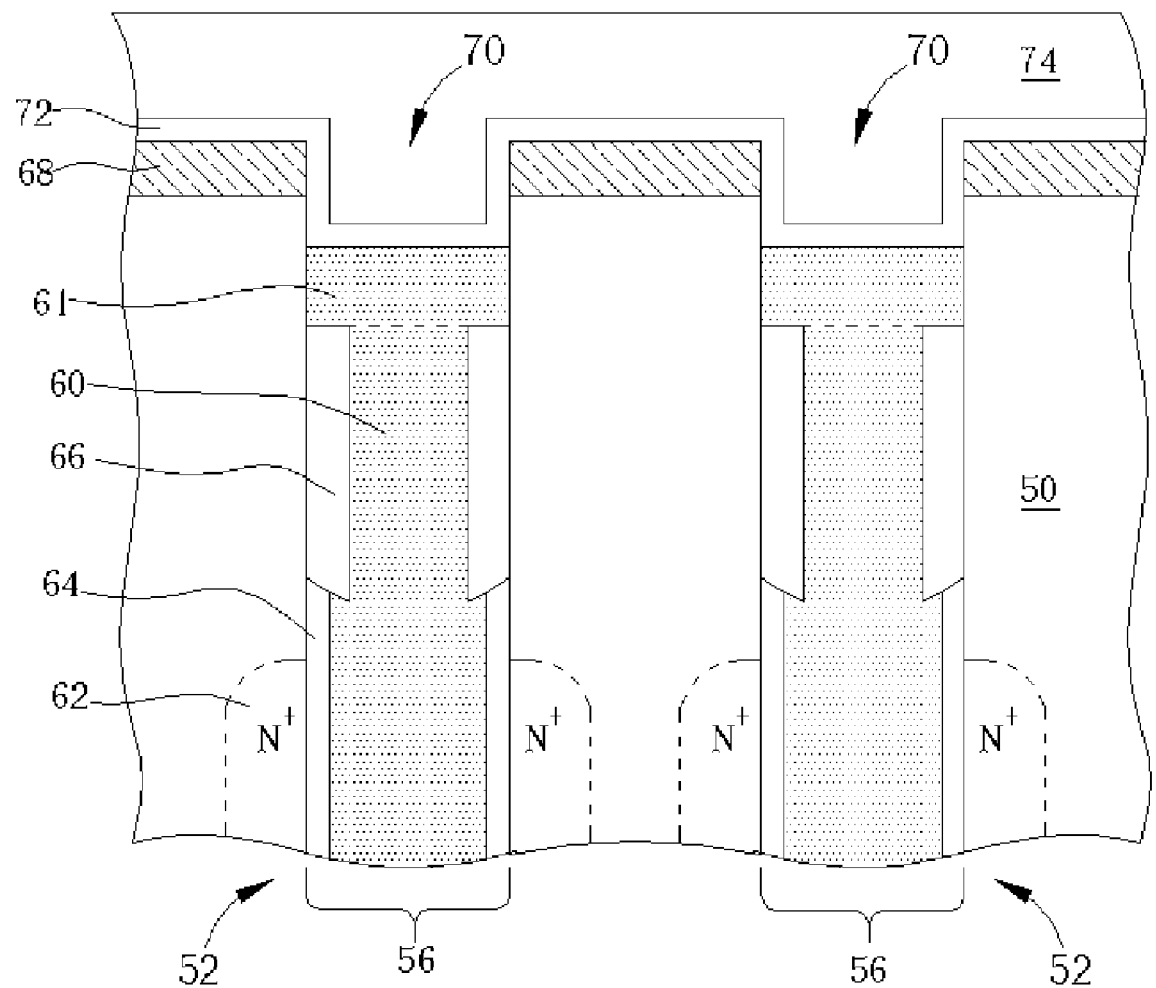

Referring to FIG. 6, a mask layer 72 and a dielectric layer 74 are deposited in sequence on the surfaces of the substrate 50 and the recess 70. Then, a chemical-mechanical polishing (CMP) process is selectively performed to planerize the dielectric layer 74. The mask layer 72 is made with nitride liner familiar to semiconductor manufacturers or other materials with high etching selectivity in contrast with the substrate 50, so that the mask layer 72 can serve as an hard mask. The material of the dielectric layer 74 can be doped silicate glass layer, such as a borosilicate glass (BSG) layer or a borophosphosilicate glass (BPSG) layer. The BSG layer is a preferable material because it can serve as a hard mask during etching processes, and the BSG layer can be easily removed by vapor hydrofluoric acid (VHF).

Figure 7:
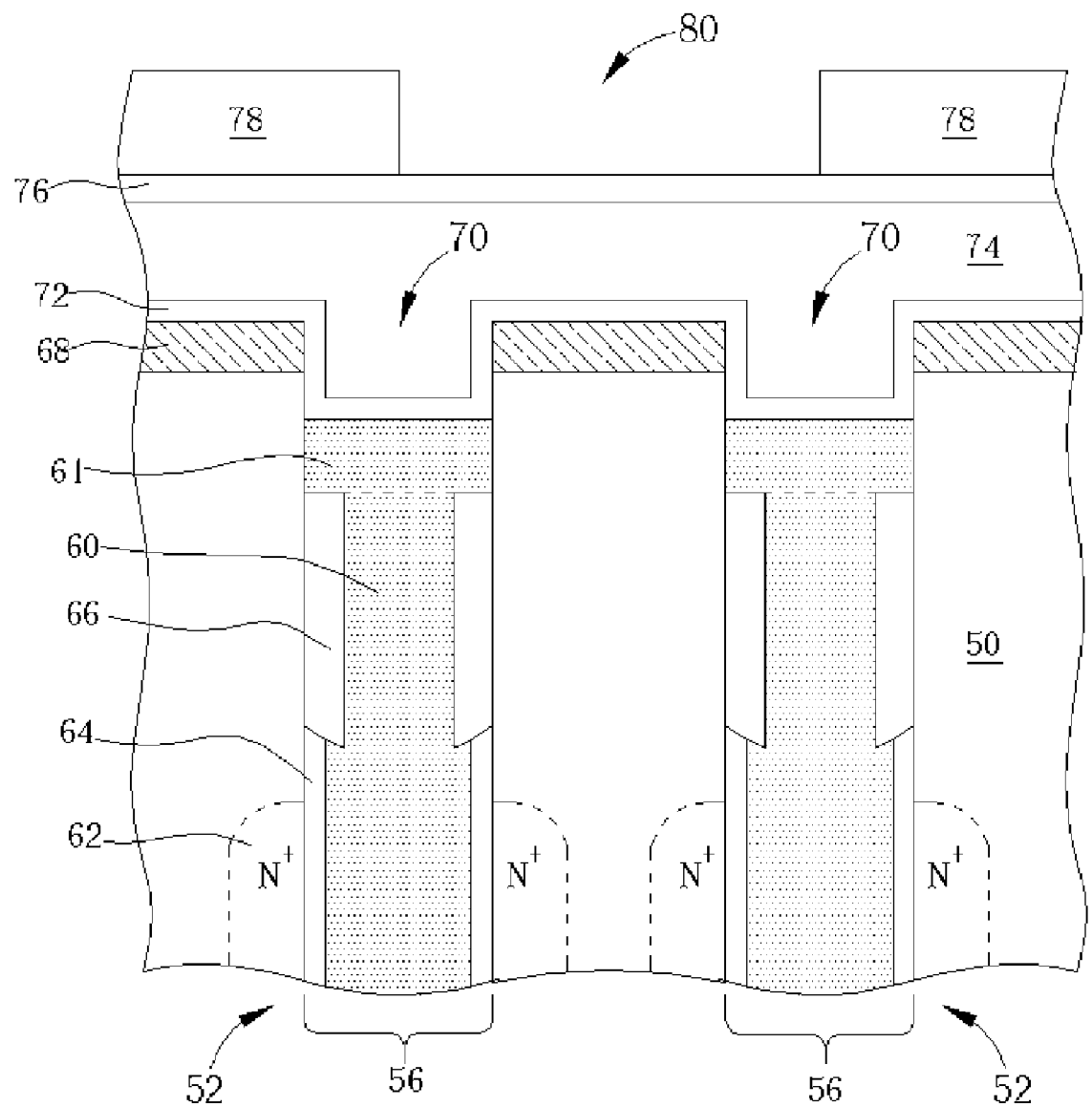

Referring to FIG. 7, a photoresist layer 78 is formed on the dielectric layer 74. Then, a lithography process is performed to pattern the photoresist layer 78 so that the photoresist layer 78 has a pattern defining at least two active areas with at least one shallow trench opening 80. In order to raise the transferring performance of the lithography process, an ARC layer 76 is selectively formed on the dielectric layer 74 before forming the photoresist layer 78.

Figure 8:
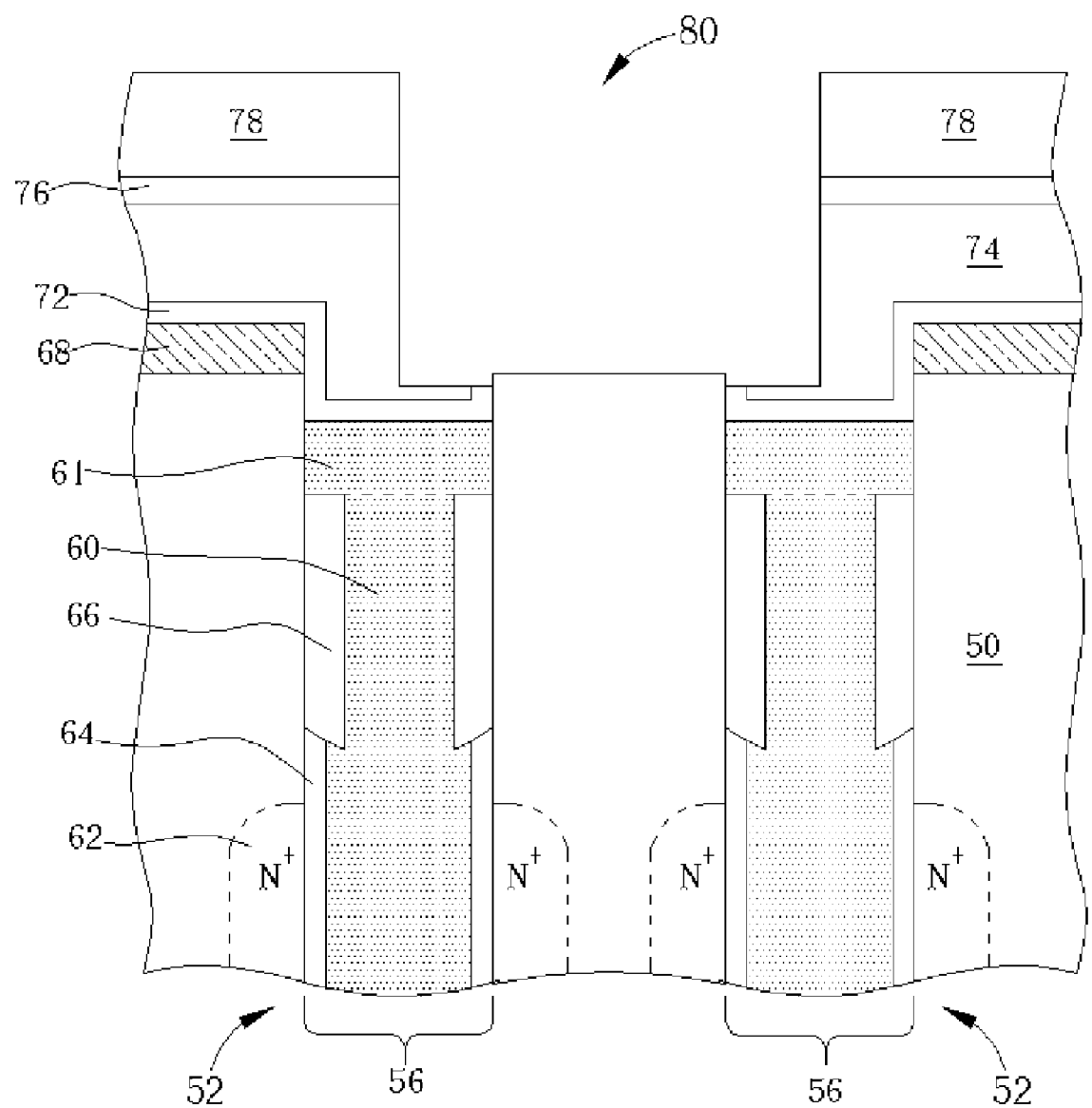

Please refer to FIG. 8. A dry-etching process is performed to etch the ARC layer 76, the dielectric layer 74, the mask layer 72, and the pad layer 68 through the shallow trench opening 80 until the substrate 50 is exposed. Meanwhile, the deep trench 56 is kept covered by the mask layer 72.

Referring to FIG. 9, a self-aligned etching process is performed by way of taking the residual mask layer 72 as an hard mask to remove a portion of the substrate 50 until the surface of the exposed substrate 50 is lower than the top of the collar oxide layer 66, which means the top of the collar oxide layer 66 is exposed, and the storage node 60, the buried strap 61, and the collar oxide layer 66 remain intact. Then, as shown in FIG. 10, the photoresist layer 78, the residual ARC layer 72, the residual dielectric layer 74, and the mask layer 72 are removed so as to form a shallow trench 82.

Referring to FIG. 11, an oxidation process is performed to oxidize the surfaces of the sidewall and the bottom of the shallow trench 82 and the pad layer 68 to form an oxide liner (not shown). Then, a nitride liner 84 is formed on the substrate 50 covering the surfaces of the sidewall and the bottom of the shallow trench 82. The oxide liner and the nitride liner 84 can ensure that the shallow trench 82 has a planar surface, and their dense structure can also ensure the isolation structure subsequently formed has better isolation performance. Finally, the shallow trench 82 is filled with isolation materials to complete the present invention isolation structure 86 (STI) of the trench capacitors 52. The isolation materials can be formed by a high density plasma chemical vapor deposition (HDP CVD) process and a CMP process to deposit a HDP oxide layer on the substrate 50 and to polish the HDP oxide layer by taking the nitride liner 84 as a stop layer.

As shown in FIG. 11, for the left trench capacitors 52, the isolation structure 86 comprises a first isolation portion 90 and a second isolation portion 92. The first isolation portion 90 is a portion of the HDP oxide layer that covers the buried strap 61. The first isolation portion 90 completely fills the top opening of the deep trench 56 and has a first thickness L1. The second isolation portion 92 directly contacts the first isolation portion 90 and is disposed on the substrate 50 out of the active areas and the deep trench 56. The bottom of the second isolation portion 92 is buried in the substrate 50 and adjacent to the buried strap 61 and the collar oxide layer 66. It should be noted that the bottom of the second isolation portion 92 is lower than the top of the collar oxide layer 66 so that the two adjacent trench capacitors 52 can be completely isolated by the isolation structure 86. In addition, the second isolation portion 92 has a second thickness L2 thicker than the first thickness L1. Taking the DRAM with a line width smaller than 0.2 microns as an example, the thickness L2 is about 2800 angstroms (Å), and the difference of the thickness L2 and the first thickness L1 is about 800 Å, which is the distance of L' shown in FIG. 11.

In contrast to the prior art, the present invention method takes two steps of etching processes to form a shallow trench of the STI to form the present invention isolation structure of trench capacitors. A mask layer, such as a nitride liner, is first formed before the BSG layer. Then the lithography and etching processes are performed to define the pattern of active areas and shallow trenches in the mask layer and the BSG layer. When etching the substrate, the mask layer is taken as a hard mask, and then isolation materials are used to fill the shallow trenches to form the STI. Since the present method has a first step that is an etching process to remove a portion of the nitride liner and the BSG layer after the lithography process, the etching process and the etching profile can be easily controlled. On the other hand, during the second step of etching process to remove a portion of the substrate to form the shallow trench, the etching performance is improved because the nitride liner, having high etching selectivity to the substrate, is taken as a hard mask. As a result, the present invention method has a self-aligning functionality that solves the problem of pattern shift resulting from photomask misalignment in the prior art, and furthermore increases the overlay window of the active areas to the deep trenches. In addition, the present invention isolation structure does not overlap the buried strap so that the contact area of the buried strap and the storage node is larger, the section area of the storage node is larger, and thus the resistance is reduced. Accordingly, the performance of trench capacitors is improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of self-aligned fabricating an isolation structure of a trench capacitor, wherein the trench capacitor is disposed in a deep trench of a substrate having a pad layer thereon, the trench capacitor comprising:
   a conductive layer filled in the deep trench, wherein a top surface of the conductive layer and a sidewall of the pad layer define a recess; and
   a collar oxide layer disposed on a surface of a sidewall of the deep trench; the method comprising:
   forming a mask layer and a dielectric layer in sequence on the substrate and a surface of the recess;
   forming a photoresist layer on the dielectric layer, the photoresist layer having an opening that defines a shallow trench;
   etching the dielectric layer, the mask layer, and the pad layer through the opening until the substrate is exposed by taking the substrate as an etching stop layer, wherein the conductive layer and the collar oxide layer are not etched at all and remain intact; and
   etching the substrate by taking the residual mask layer as a hard mask until a surface of the exposed substrate is lower than a top of the collar oxide layer, wherein the conductive layer and the collar oxide layer remain intact.

2. The method of claim 1 further comprising:
   removing the photoresist layer, the dielectric layer, and the mask layer so as to form the shallow trench; and
   filling the shallow trench with an isolation material.

3. The method of claim 2 further comprising performing an oxidation process after forming the shallow trench so as to form a oxide liner on a bottom and a sidewall of the shallow trench.

4. The method of claim 3 further comprising forming a nitride liner on the bottom and the sidewall of the shallow trench after forming the oxide liner.

5. The method of claim 2, wherein the isolation material comprises silicon oxide.

6. The method of claim 5, wherein filling the shallow trench with silicon oxide comprises:
   performing a HDPCVD process to deposit a silicon oxide layer on the substrate; and
   performing a chemical-mechanical polishing (CMP) process so that a surface of the silicon oxide layer is approximately coplanar with a surface of the pad layer.

7. The method of claim 1, wherein the mask layer comprises silicon nitride.

8. The method of claim 1, wherein the dielectric layer comprises borosilicate glass (BSG).

9. The method of claim 8 further comprising performing a CMP process after depositing the BSG layer.

10. The method of claim 1 further comprising depositing an anti-reflection coating (ARC) on the dielectric layer.

11. The method of claim 1, wherein the mask layer positioned covering the top surface of the conductive layer is not etched at all through the process of etching the dielectric layer, the mask layer, and the pad layer through the opening by taking the substrate as the etching stop layer and completely covers the conductive layer.

12. The method of claim 1, wherein a top surface of the mask layer covering the top surface of the conductive layer is lower than the surface of the substrate.

* * * * *